(12) United States Patent
Yoshida et al.

(10) Patent No.: US 7,755,911 B2
(45) Date of Patent: Jul. 13, 2010

(54) PRINTED WIRING BOARD

(75) Inventors: Masaoki Yoshida, Shizuoka (JP);
Takuya Nakayama, Shizuoka (JP); Koji Ueyama, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 106 days.

(21) Appl. No.: 12/081,503

(22) Filed: Apr. 16, 2008

(65) Prior Publication Data
US 2008/0310133 A1     Dec. 18, 2008

(30) Foreign Application Priority Data
Apr. 19, 2007   (JP)   ............... 2007-110356

(51) Int. Cl.
*H01R 9/00* (2006.01)
(52) U.S. Cl. .............. 361/772; 361/773; 361/774; 361/777
(58) Field of Classification Search ......... 361/772–777, 361/825–835
See application file for complete search history.

(56) References Cited

U.S. PATENT DOCUMENTS

| 4,139,881 A | * | 2/1979 | Shimizu et al. | ............. 361/760 |
| 4,541,034 A | * | 9/1985 | Fanning | ...................... 361/773 |
| 5,706,178 A | * | 1/1998 | Barrow | ........................ 361/777 |
| 6,088,234 A | * | 7/2000 | Ishikawa et al. | ............ 361/760 |
| 6,570,774 B1 | * | 5/2003 | Moriwaki et al. | ........... 361/760 |

FOREIGN PATENT DOCUMENTS

JP        2005-51133        2/2005

* cited by examiner

*Primary Examiner*—Tuan T Dinh
(74) *Attorney, Agent, or Firm*—Edwards Angell Palmer & Dodge LLP

(57) ABSTRACT

A printed wiring board which can certainly prevent damage of conductive pattern caused by the terminal. The printed wiring board has a board, a conductive pattern, a through-hole and a non-conductive area. A lead wire of resistance mounted on the printed wiring board is inserted into the through-hole 4. The lead wire projects from a surface of the board, and is bent close to the surface. The non-conductive area is formed into a fan-shaped shape enlarging toward a tip of the lead wire from a center of the through-hole. Because the bent lead wire is arranged on the non-conductive area, the non-conductive area can prevent damage of the conductive pattern which is caused by touching the lead wire to the conductive pattern.

2 Claims, 5 Drawing Sheets

PRINTED WIRING BOARD

The priority application Number Japan Patent Application No. 2007-110356 upon which this patent application is based is hereby incorporated by reference.

BACKGROUND OF THE INVENTION

1. Field of the Invention

This invention relates to a printed wiring board on which electric components are mounted.

2. Description of the Related Art

Generally, various electronic devices, for example, a light such as headlights and a rear light, and a motor such as a starter motor and a motor for an air conditioner, are mounted in a vehicle as a mobile object. A junction block is arranged on a vehicle so as to provide these electronic devices with electrical power. The junction block is included by putting together various electric circuit units of multiple fuses and relays.

Also, a junction block has fuses, relays and bus bars. Thereby, the junction block is called a fuse box, a relay box or an electric connection box. In the present specification, the above mentioned fuse box, the relay box and the junction block are referred to as an electric connection box.

For example, a power distribution unit which internally receives electric component such as relays and fuses is equipped with an electric connection box. Electric power from a battery is inputted into the power distribution unit, and the electric power is output into each electronic devices through electric components received into the power distribution unit. In addition, these electric components are mounted on the printed wiring board. It is required that the power distribution unit is made smaller and lighter.

The printed wiring board has an insulation board, a conductive pattern, a through-hole and a land. The conductive pattern is arranged on the board and formed by a predetermined circuit. A terminal of an electric component is inserted into the through-hole penetrating the board. The land is disposed on a periphery of the through-hole.

A relatively small electric component such as a resistor is temporarily fixed on the printed wiring board by bending a terminal, which is inserted into the through-hole and projects from a surface side of the board, close to the surface of the board. Thereafter, the electric component is soldered to the printed wiring board. Thereby, in a soldering process, even if a molten solder is sprayed near the terminal and the through-hole, the electric component is soldered to a desired position without displacement. However, when the terminal is bent, a tip of the terminal damages a conductive pattern. As a result, there is a possibility that the conductive pattern cannot conduct electricity, and the tip of the terminal causes a short-circuit by connecting the tip with an adjacent conductive area.

The following printed wiring board is designed for solving the above mentioned problems (for example, see the patent document 1). The land of such a printed wiring board is formed into a teardrop shape. The terminal of the printed wiring board is bent along a longitudinal direction, and arranged on the land. Thereby, the terminal does not come in contact with the conductive pattern.

Patent document 1:
Japan published patent application 2005-51133

SUMMARY OF THE INVENTION

The land of the above mentioned printed wiring board is formed into a teardrop shape. That is, because one end away from the through-hole is formed into a tapered elliptical shape, a direction to bend the terminal is limited. For this reason, according to the accuracy of production equipment, the terminal is bent as protruding from the land. Also, according to the looseness into the through-hole of the terminal, the bent terminal protrudes on an outside of the land. Furthermore, it is possible that the terminal protrudes from an outside of the land by connecting a terminal, which is bent during assembling work, with another part. Additionally, a tip of the terminal protruding from the land damages a conductive area. As a result, the conductive area causes conductive failure, and the tip of the terminal causes short by connecting with an adjacent conductive area.

Consequently, an object of the present invention is to provide a printed wiring board for preventing damages of the conductive pattern by the terminal.

According to a first aspect of the present invention, an electric component is mounted on a printed wiring board of the present invention. The printed wiring board has an insulation board, a conductive pattern and a through-hole. The conductive pattern is arranged on the board and is formed into a prescribed circuit. The through-hole penetrates the board. A terminal of the electric component, which is inserted into the through-hole, projects from a surface of the board. By bending the terminal close to the surface of the board, the electric component is mounted on the printed wiring board. Furthermore, the printed wiring board has a non-conductive area which prevents contact with the terminal, which expands toward a tip of the terminal from a center of the through-hole, and the conductive pattern.

According to a second aspect of the present invention, the non-conductive area is formed into a fan-shaped shape.

According to the invention, because the printed wiring board has the non-conductive area, the terminal is certainly positioned in the non-conductive area even if the terminal is bent to away from a bending direction and the bent terminal is moved. Furthermore, the non-conductive area prevents contact with the terminal and the conductive pattern. Therefore, the non-conductive area of the present invention can prevent damages of the conductive pattern by the tip of the terminal. In addition, short by connecting the bent terminal with an adjacent conductive pattern can be prevented.

Additionally, according to the invention, because the non-conductive area is formed into a fan-shaped shape from the center of the through-hole, the non-conductive area can be made in minimal size, and a limit of the non-conductive area can be minimized when the conductive pattern is designed. Also, the conductive pattern can be connected with the terminal inserted into the through-hole on a surface side of the board without the need to surround whole periphery of the through-hole by the non-conductive area. Thereby, limits for designing the conductive pattern can be reduced.

The above and other objects and features of this invention will become more apparent from the following description taken in conjunction with the accompanying drawings.

BRIEF DESCRIPTION OF THE DRAWINGS

FIG. 1 is a front view of a power distribution unit having a PCB assembly including a printed wiring board;

FIG. 2 is a rear view of the PCB assembly of FIG. 1;

DETAILED DESCRIPTION OF AN EXEMPLARY EMBODIMENT

Figure 1:
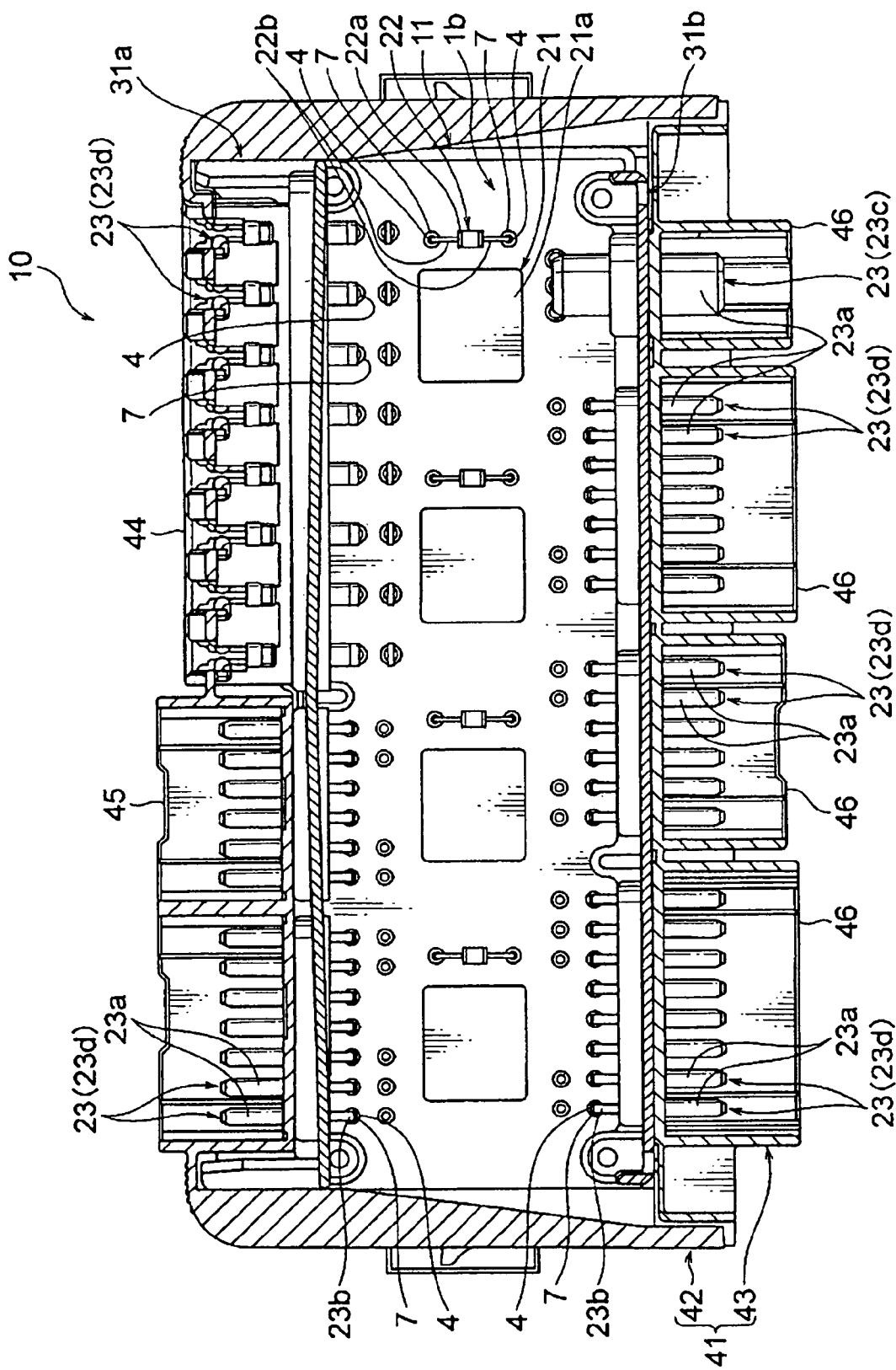
FIG. 1 is
Figure 2:
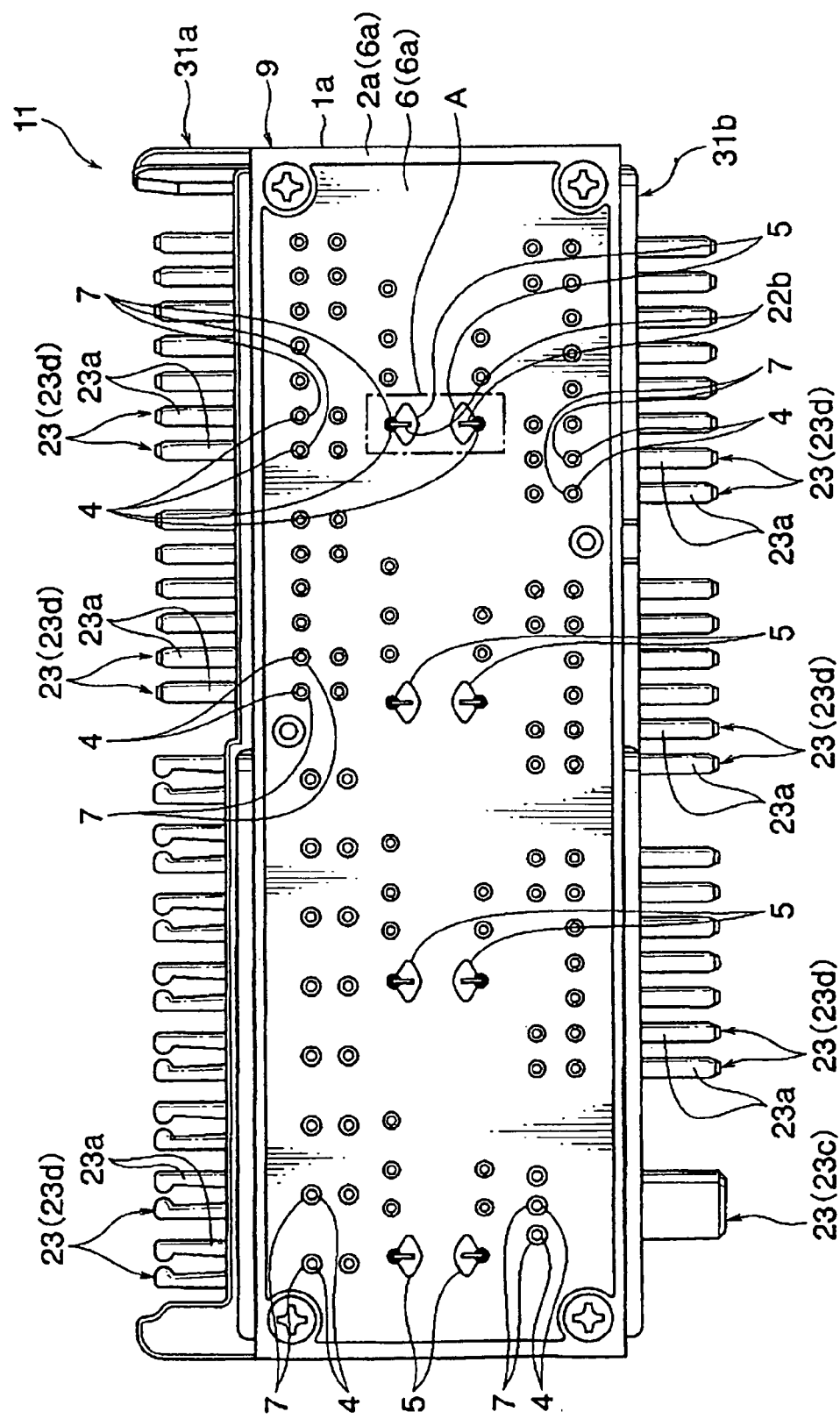
FIG. 2 is

Embodiments of a printed wiring board 1a of the present invention are explained referring to FIGS. 1-5. The printed wiring board 1a is used with a power distribution unit 10 which is received into an electric connection box such as mounted on a vehicle. As shown in FIG. 2, a PCB (printed circuit board) assembly 11 includes the printed wiring board 1a.

As shown in FIG. 1, the power distribution unit 10 has the PCB assembly 11 and a case 41 receiving the PCB assembly 11. The PCB assembly 11 has a base plate 9 including a pair of printed wiring boards 1a and 1b and a conductive plate 8 (FIG. 4), a relay 21 mounted on the base plate 9, a resistor 22, a terminal board 23 and connector blocks 31a, 31b. The resistor 22, the terminal board 23 and connector blocks 31a, 31b are used as an electric component.

Figure 4:
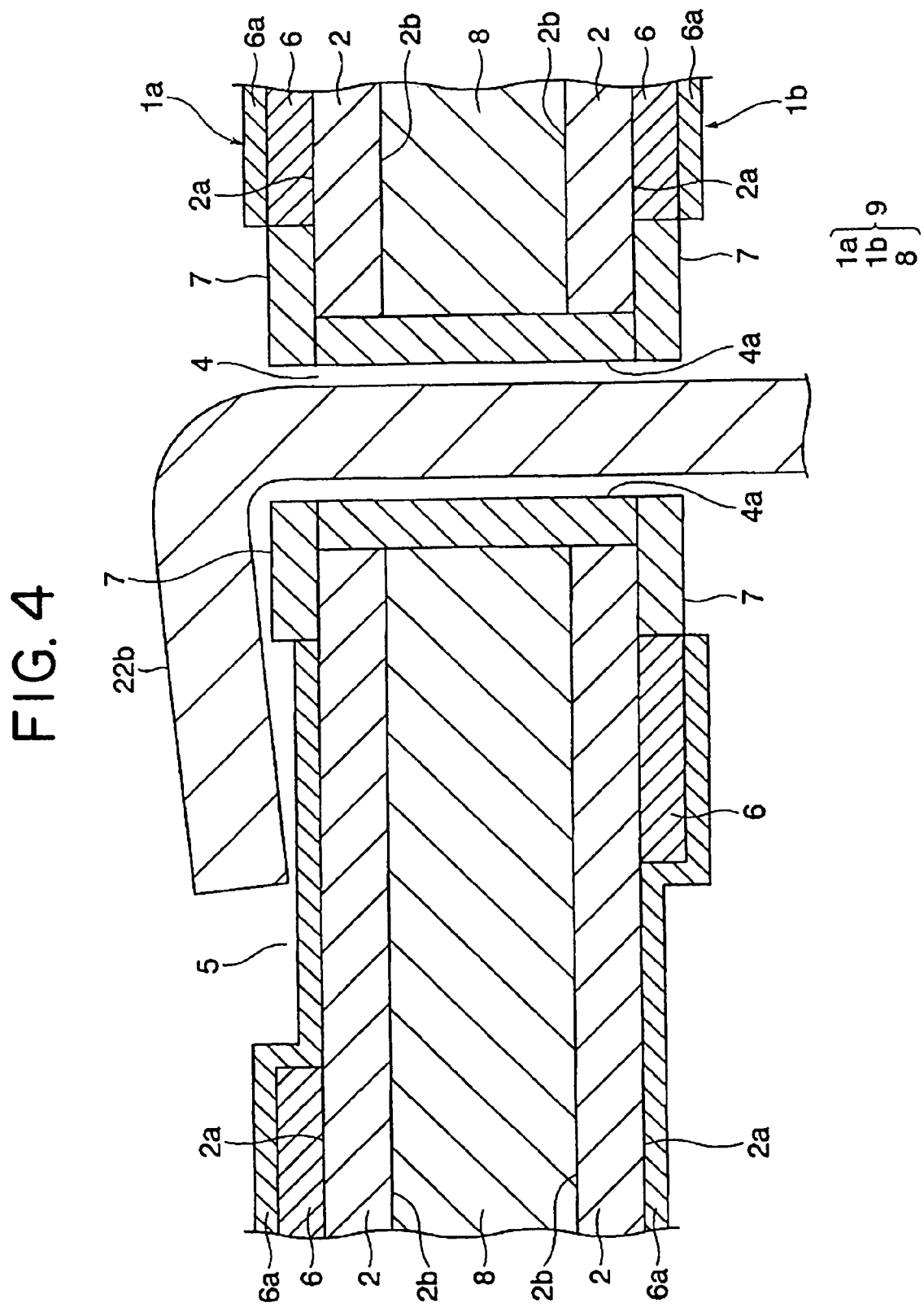
FIG. 4 is a sectional view taken along the line IV-IV in FIG. 3.
Figure 5:
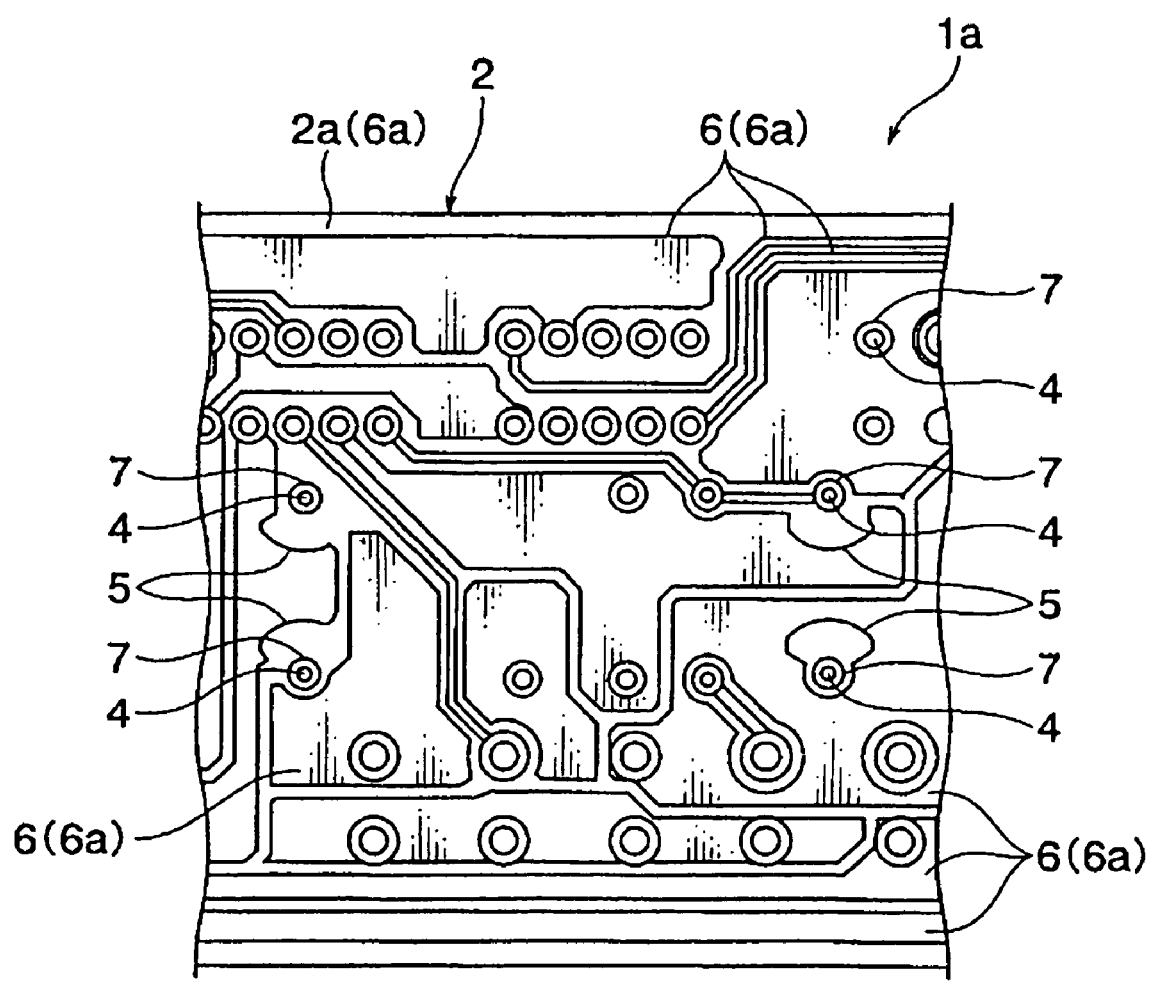
FIG. 5 is a front view showing a non-conductive area being different from a shape of the non-conductive area shown in FIG. 2.

As shown in FIG. 4, the base plate 9 has the pair of printed wiring boards 1a, 1b and a conductive plate 8 arranged between the pair of the printed wiring boards 1a, 1b. These are superposed on each other, and formed together. The pair of the printed wiring boards 1a, 1b have the same construction. Therefore, one of the pair of the printed wiring boards (herein after, the printed wiring board 1a) is explained.

Each of the printed wiring boards 1a, 1b mounts the relay 21 and the resistor 22, as shown in FIG. 1 for printed wiring board 1b. As shown in FIG. 4, the printed wiring board 1a has an insulation board 2, a conductive pattern 6 and a through-hole 4 penetrating the board 2. The conductive pattern 6 is arranged on a surface 2a of the board 2, and is formed by a predetermined circuit. The board 2 is made of insulation synthetic resin. Also, the board is formed into a flat plate shape, and has a rectangular shape.

The conductive pattern 6 is formed into a filmy shape from conductive metal such as a copper. As shown in FIG. 4, the conductive pattern 6 is laminated to the surface 2a of the board 2. A planar shape of the conductive pattern 6 is formed into a rectangular shape. However, the conductive pattern 6 is formed into various shapes by circuit configuration. Thereby, the conductive pattern 6 can be formed into various shapes in the present invention.

In a surface of the conductive pattern 6 (and the surface 2a on which the conductive pattern 6 is not arranged), a solder resist layer 6a is made from thermosetting epoxy resin. The solder resist layer 6a prevents a solder from adhering to the conductive pattern 6 when soldering. Furthermore, by covering the conductive pattern 6 with the solder resist layer 6a, the solder resist layer 6a works as an insulating layer and is prevented from corrosion of the conductive pattern 6.

As shown in FIG. 4, the through-hole 4 penetrates the board 2 of the printed wiring board 1a, the conductive plate 8 overlapping the printed wiring boards 1a, 1b and the board 2 of another of the pair of the printed wiring boards (here after, the printed wiring board 1b). A planer shape of the through-hole 4 is formed into a circle shape, and multiple through-holes are arranged. In the respective through-holes 4, any one of connecting terminal of the relay 21, a lead wire 22b such as a terminal of the resistor 22, or a connecting portion 23b of the terminal board 23 is inserted (FIG. 4 is showing the through-hole 4 in which the lead wire 22b is inserted). An inner diameter of the through-hole 4 is formed a little bit larger than outer diameters of the connecting terminal, the lead wire 22b and the connecting portion 23b. A plated layer 4a is formed with the entire inner surface of the through-hole 4 made of copper plating. A land 7 is formed with the plated layer 4a together, and is arranged around the through-hole 4.

The land 7 is formed into a filmy shape from conductive metal such as a copper, and laminated to the surface 2a of the board 2. A planer shape of the land 7 is formed into an annulus ring shape. The land 7 is provided consecutively, and connected electrically with the conductive pattern 6. So that a surface of the land 7 is exposed to outside, a solder adheres to the surface of the land 7 when the relay 21, the resistance 22 and the terminal board 23 are soldered. The land 7 is soldered to the connecting terminal of the relay 21 inserted into the through-hole 4, the lead wire 22b of the resistor 22 and the connecting portion 23b of the terminal board 23.

In the above mentioned base plate 9, the connecting terminal of the relay 21, the lead wire 22b of the resistor 22 and the connecting portion 23b of the terminal board 23 are inserted into the through-hole 4 toward the printed wiring board 1a side from the printed wiring board 1b side. The connecting terminal, the lead wire 22b ad the connecting portion 23b projects from the printed wiring board 1a (that is, the surface 2a of the board 2 of the printed wiring board 1a). A relay body 21a of the relay 21, a resistance body 22a of the resistor 22 and a terminal portion 23a of the terminal board 23 are disposed on the printed wiring board 1b side of the base plate 9.

The conductive plate 8 is formed with conductive metal. The conductive plate 8 is formed into a plate shape, and has a rectangular shape. A planar shape of the conductive plate 8 is conformed to planar shapes of the boards 2 of each printed wiring boards 1a, 1b. The conductive plate 8 is divided in several parts, and forms a predetermined circuit. A pair of outer surfaces opposed to each other of the conductive plate 8 is overlapped on rear surfaces 2b of the boards 2 of the printed wiring boards 1a, 1b. The conductive plate 8 is connected electrically to the land 7 of the printed wiring boards 1a, 1b by the plated layer 4a arranged in the through-hole 4.

In the above mentioned base plate 9, the connecting terminal of the relay 21, the lead wire 22b of the resistor 22 and the connecting portion 23b of the terminal board 23 are inserted into the through-hole 4 toward the printed wiring board 1a side from the printed wiring board 1b side. The connecting terminal, the lead wire 22b and the connecting portion 23b projects from the printed wiring board 1a (that is, the surface 2a of the board 2 of the printed wiring board 1a). A relay body 21a of the relay 21, a resistance body 22a of the resistor 22 and a terminal portion 23a of the terminal board 23 are disposed on the printed wiring board 1b side of the base plate 9.

The relay 21 is pushed in the printed wiring board 1a side from the printed wiring board 1b side by a pressing method (not shown), and temporarily fixed on the base plate 9. The terminal board 23 is attached on the connector blocks 31a and 31b. The connector blocks 31a and 31b are screwed and clamped to the base plate 9, and temporarily fixed on the base plate 9. Thereafter, the relay 21 and the terminal board 23 are soldered.

The resistor 22 is bent to a direction approaching the surface 2a of the board 2 and a direction on which each lead wires 22b of one of the resistor 22 approaches each other. After the resistor 22 is temporarily fixed on the base plate 9, the resistor 22 is soldered. The printed wiring board 1a has a non-conductive area 5. The non-conductive area 5 expands toward a tip of the lead wire 22b, which is bent from a center of the through-hole 4, and prevents contact with the bent lead wire 22b and the conductive pattern 6.

Figure 3:
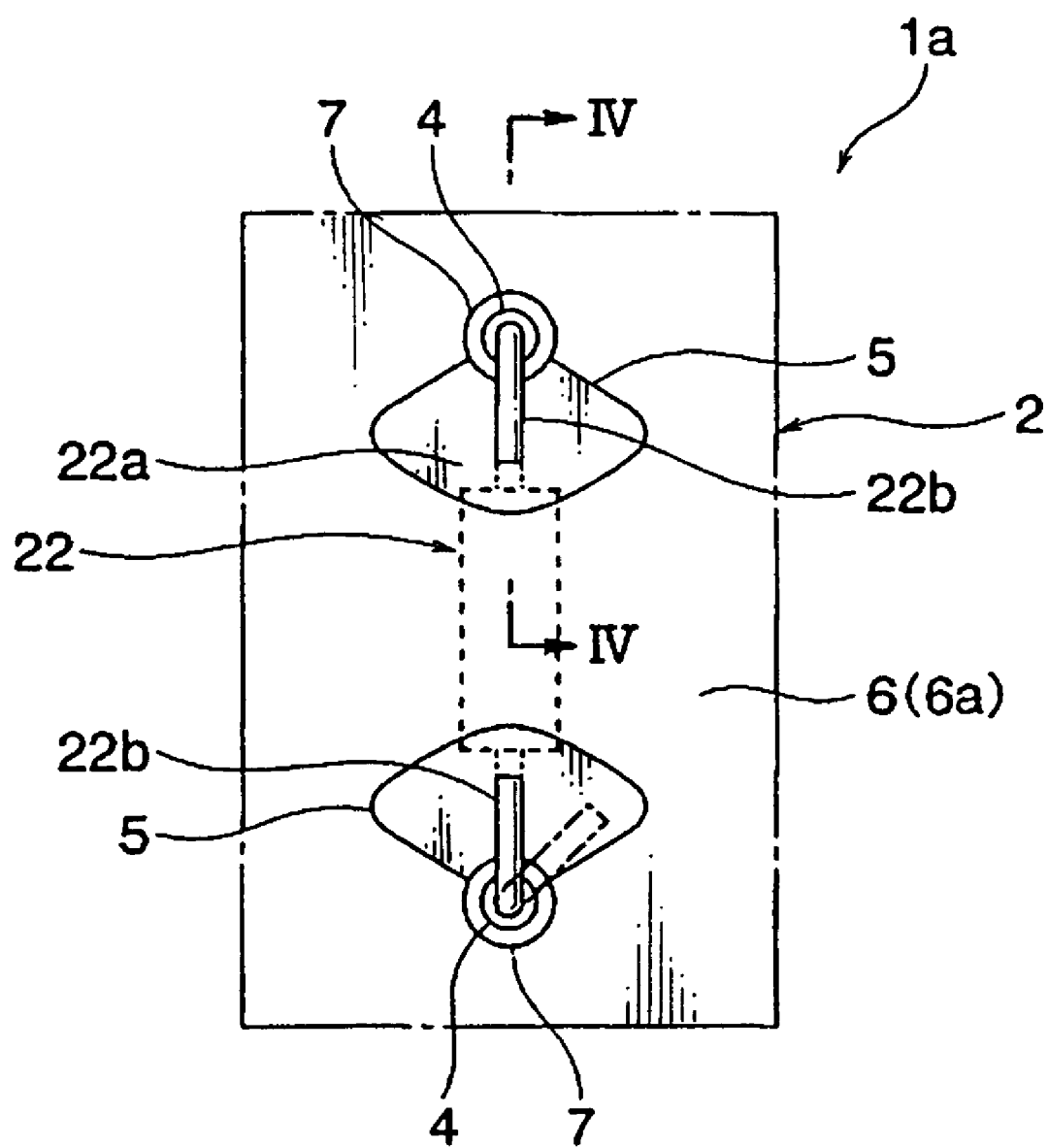
FIG. 3 is an enlarged view of an A part of FIG. 2.

The non-conductive area 5 is arranged on the surface 2a of the board 2 in the printed wiring board 1a. The non-conductive area 5 is a part of the surface 2a on which the conductive pattern 6 of the board 2 is not disposed. In addition, the above mentioned solder resist layer 6a is formed into a surface of the non-conductive area 5. As shown in FIG. 3, the non-conductive area 5 is arranged near the through-hole 4 in which the lead wire 22b of the resistor 22 is inserted, and touches the land 7. The non-conductive area 5 is arranged along a direction in which the lead wire 22b is bent. The non-conductive area 5 is formed into a fan-shaped shape with a focus on the through-hole 4. Overall length of the bent lead wire 22b is located at the non-conductive area 5.

The above mentioned non-conductive area 5 can be made easily during the production processes of the conductive pattern 6. For example, when an area in which the conductive pattern 6 is created is masked and etches, it is unnecessary to mask an area in which the non-conductive area 5 is created.

Also, the non-conductive area 5 is formed into various shapes by a shape of the conductive pattern 6. For example, as shown in a left side of FIG. 5, the non-conductive area 5 formed into a fan-shaped shape is connected to the surface 2a of the board 2 in which the conductive pattern 6 is not formed, and the non-conductive area 5 can be formed into a shape which two non-conductive area 5 is connected to each other. Even if the non-conductive pattern 5 has such a shape, it operates as with the fan-shaped non-conductive pattern 5.

The relay 21 has a relay body 21a formed into a rectangular parallelepiped shape, and a plurality of connecting terminals which project from an outer surface of one of the relay body 21a. The connecting terminal is formed with metal such as a steel product. As mentioned above, the connecting terminal is inserted into the through-hole 4, and projects from the printed wiring board 1a side of the base plate 9. Furthermore, the connecting terminal is soldered to the land 7. Thereby, the relay 21 is mounted on the printed wiring board 1a.

The resistor 22 has the columnar resistance body 22a and a pair of the lead wires 22b. The lead wires 22b project from longitudinal both ends in the resistance body 22a. The lead wires 22b are formed with metal such as a tinned copper. The lead wire 22b, as described above, is inserted into the through-hole 4, and projects from the printed wiring board 1a side. Thereafter, the lead wire 22b is bent and soldered to the land 7. Thereby, the resistor 22 is mounted on the printed wiring board 1a.

The terminal board 23 is formed with conductive sheet metal, and a plurality of the terminal boards 23 is disposed. The base plate 9 is electrically connected with a fuse mounted on the power distribution unit 10 and a connector of wiring harness of electric connection box by the terminal board 23. The terminal board 23 has the terminal portion 23a and the connecting portion 23b. The terminal portion 23a is arranged on one end of lengthwise direction, and exposed to outside of the power distribution unit 10. The connecting portion 23b is arranged on the other end of lengthwise direction, and electrically connected with the base plate 9. As mentioned above, the connecting portion 23b is inserted into the through-hole 4, projects from the printed wiring board 1a side of the base plate 9, and is soldered the land 7. Thereby, the terminal board 23 is connected with the base plate 9. The terminal portion 23a is electrically connected with a terminal of the fuse and a terminal of the connector of the wiring harness.

The connector blocks 31a, 31b are made of insulation synthetic resin. The connector blocks 31a, 31b are screwed and clamped to the printed wiring board 1b side of the base plate 9. The connector blocks 31a, 31b are disposed on both ends of the base plate 9 (up-and-down direction in FIG. 1), and provided over all of longitudinal of the base plate 9.

One of the connector blocks 31a (here after, the connector block 31a) has a main body, a terminal hole penetrating the main body, and a stand portion (shown in an upper side of FIG. 1). The main body is formed into a tabular shape. The stand portion is arranged on both ends of longitudinal of the main body, and stands from the main body. The connector block 31a passes the terminal portion 23a of the terminal board 23 through the terminal hole. The main body of the connector block 31a is assembled perpendicular to a surface of the base plate.

Another of the connector blocks 31b (here after, the other connector block 31b) has a main body formed into a tabular shape, and a terminal hole penetrating the main body (shown in a down side of FIG. 1). The other connector block 31b passes the terminal portion 23a of the terminal board 23 through the terminal hole. The main body of the other connector block 31b is assembled perpendicular to a surface of the base plate.

As shown in FIG. 1, the case 41 has an upper case 42 and a lower case 43. The upper case 42 has an upper wall and a peripheral wall connected to a peripheral border of the upper wall, and is formed into a flat box shape. The upper wall has a plurality of exposed holes, a fuse attachment portion 44 and a connector hood 45. The exposed hole penetrates the upper wall. Also, the terminal portion 23a of the terminal board 23 passed through the terminal hole of the connector block 31a is inserted into the exposed hole. The fuse attachment portion 44 is disposed on one end of longitudinal of the upper wall. A fuse is mounted on the fuse attachment portion 44, and electrically connected to the terminal portion 23a inserted into the exposed hole.

The connector hood 45 is disposed on the other end of longitudinal of the upper wall. The connector hood 45 is formed into a hood shape, connected to the upper wall, and projected in a direction opposite to the peripheral wall. In the connector hood 45, the terminal portion 23a of the terminal board 23 inserted into the exposed hole projects. A connector of wiring harness is mounted on the connector hood 45 from an upper side of the power distribution unit 10 (upside of FIG. 1). The terminal board 23 is connected to outside passing through the terminal of the connector.

The lower case 43 has a bottom wall, a peripheral wall connected to a peripheral border of the bottom wall and a plurality of partition walls connected to the peripheral wall. The lower case 43 is formed into a box shape. The bottom wall has a plurality of exposed holes and a connector hood 46. The exposed hole penetrates the bottom wall, and the terminal portion 23 of the terminal board 23 passed through the terminal hole of the other connector block 31b is inserted thereto. The connector hood 46 is formed with a part of the peripheral wall and the partition wall.

A plurality of the connector hoods 46 are arranged along a lengthwise direction of the bottom wall abreast to each other. The connector hood 46 is formed into a hood shape, and projected on a direction away from the upper case 42 mounted on the connector block 31a. In the connector hood 46, the terminal portion 23a of the terminal board 23 inserted into the exposed hole projects. A connector of wiring harness is mounted on the connector hood 46 from a under side of the power distribution unit 10 (downside of FIG. 1). The terminal board 23 is connected to outside through the terminal of the connector.

The above mentioned case 41 is mounted on the peripheral wall of the lower case 43 as the peripheral wall of the upper case 42 overlaps, and assembled in a case shape. Also, the case 41 receives the PCB assembly 11 to inside.

When the above mentioned structural power distribution unit 10 is assembled, first the connecting terminal of the relay 21, the lead wire 22b of the resistance and the connecting portion 23b of the terminal board 23 which mounted previously on the connector blocks 31a, 31b are inserted into the through-hole 4. Thereafter, the relay 21, the resistance 22 and the terminal board 23 are placed on the base plate 9.

The relay 21 and the terminal board 23 are temporarily fixed on the base plate 9 as mentioned above. The resistor 22 is temporarily fixed on the base plate 9 by bending the lead wire 22b which project on the printed wiring board 1a side. As shown in FIGS. 3 and 4, the bent lead wire 22b is positioned in the non-conductive area 5. The non-conductive area 5 is formed into a fan-shaped shape with a focus on the through-hole 4. Although the lead wire 22b is bent to a direction away from a predetermined direction by accuracy of production equipment, and moved after the lead wire 22b is bent, the lead wire is certainly placed in the non-conductive area 5. Therefore, because the lead wire 22b does not touch on the non-conductive pattern 6, the conductive pattern 6 is not damaged by the lead wire 22b.

Next, soldering is performed by known flow system. The land 7 of the printed wiring board 1a, the connecting terminal, the lead wire 22b and the connecting portion 23b are joined by molten solder from a solder bath. Furthermore, the relay 21, the resistor 22 and the terminal board 23 are soldered on the land 7, and they are mounted on the printed wiring board 1a. Thereby, the PCB assembly 11 is assembled.

In addition, the power distribution unit 10 is assembled by attaching the lower case 43 and the upper case 42 to the PCB assembly 11 and attaching a fuse to the fuse attachment portion 44. In this power distribution unit 10, electric power is inputted to a terminal board 23c of one of plurality of terminal boards 23. The electric power passes through the relay 21, the resistor 22 and the fuse, which are received into the power distribution unit 10, and is outputted from a part of another terminal board 23d to various electronic devices.

In embodiment of the present invention, because the printed wiring board 1a is provided with the non-conductive area 5 formed into a shape expanding toward a tip of the lead wire 22b from a center of the through-hole 4, the lead wire 22b is certainly located on the non-conductive area 5 even if the lead wire 22b which is bent to a direction differing from a predefined direction is moved. Furthermore, the non-conductive area 5 can prevent contact with the bent lead wire 22b and the conductive pattern 6. Therefore, the non-conductive area 5 can protect from damage of the conductive pattern 6 by the tip of the lead wire 22b, and be prevented from short-circuiting by connecting the bent lead wire 22b with the adjacent conductive pattern 6.

The non-conductive area 5 can be made with a minimum size so that the non-conductive area is formed into a fan-shaped shape. As a result, a limit according to the non-conductive 5 can be minimized when the conductive pattern 6 is designed. Additionally, since it is unnecessary to enclose whole periphery of the through-hole 4 with the non-conductive 5, the conductive pattern 6 can be connected to the lead wire 22b inserted into the conductive pattern 6 and the through-hole 4 in the surface 2a side of the board 2 of the printed wiring board 1a. Thereby, a limit when the conductive pattern 6 is designed can reduce more.

The embodiments of the present invention are only exemplary and not limited thereto. Any modification and alteration are within the scope of the present invention.

What is claimed is:

1. A printed wiring board, comprising:
    an insulation board;
    a conductive pattern arranged on the board and formed into a predetermined circuit;
    a through-hole penetrating the board; and
    a non-conductive area,
    wherein a terminal of an electric component inserted into the through-hole projects from a surface of the board,
    wherein the electric component is mounted on the printed wiring board by bending the terminal toward the surface of the board,
    wherein the non-conductive area is formed into a shape expanding toward a tip of the terminal of the electric component from a center of the through-hole, and
    wherein a bent portion of the terminal is positioned on the non-conductive area such that contact between the bent portion of the terminal and the conductive pattern is securely prevented.

2. The printed wiring board as claimed in claim 1, wherein the non-conductive area is formed into a fan-shaped shape.

* * * * *